United States Patent
Kodaira et al.

(10) Patent No.: US 9,171,880 B2
(45) Date of Patent: Oct. 27, 2015

(54) PHOTOELECTRIC CONVERSION DEVICE, METHOD OF MANUFACTURING THE SAME, AND CAMERA

(71) Applicant: CANON KABUSHIKI KAISHA, Tokyo (JP)

(72) Inventors: Shinji Kodaira, Kawasaki (JP); Hideshi Kuwabara, Yamato (JP); Tomohisa Kinugasa, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 14/320,818

(22) Filed: Jul. 1, 2014

(65) Prior Publication Data

US 2015/0029363 A1 Jan. 29, 2015

(30) Foreign Application Priority Data

Jul. 25, 2013 (JP) ................... 2013-154959

(51) Int. Cl.
| | |
|---|---|
| H04N 9/64 | (2006.01) |
| H01L 27/146 | (2006.01) |
| H04N 5/361 | (2011.01) |
| H04N 5/3745 | (2011.01) |

(52) U.S. Cl.
CPC ...... H01L 27/14689 (2013.01); H01L 27/1461 (2013.01); H01L 27/14603 (2013.01); H01L 27/14612 (2013.01); H04N 5/361 (2013.01); H04N 5/37452 (2013.01)

(58) Field of Classification Search
CPC ...................................... H04N 5/361
USPC ........................... 348/243; 257/291
See application file for complete search history.

(56) References Cited

U.S. PATENT DOCUMENTS

| | | | |
|---|---|---|---|
| 6,255,680 B1 | 7/2001 | Nakashiba | |
| 7,692,713 B2 | 4/2010 | Kinugasa et al. | |
| 8,013,369 B2 | 9/2011 | Iwata et al. | |
| 8,243,190 B2 | 8/2012 | Kinugasa et al. | |
| 8,415,724 B2 | 4/2013 | Iwata et al. | |
| 8,605,182 B2 | 12/2013 | Totsuka et al. | |
| 8,836,837 B2 | 9/2014 | Kinugasa | |
| 2010/0243864 A1 | 9/2010 | Itonaga | |
| 2011/0134286 A1 | 6/2011 | Inoue et al. | |
| 2014/0253774 A1 | 9/2014 | Ogura et al. | |
| 2015/0028401 A1* | 1/2015 | Kuwabara | 257/291 |

FOREIGN PATENT DOCUMENTS

| | | |
|---|---|---|
| JP | 11-345957 A | 12/1999 |
| JP | 2005-223146 A | 8/2005 |

(Continued)

*Primary Examiner* — Usman Khan
(74) *Attorney, Agent, or Firm* — Fitzpatrick, Cella, Harper & Scinto

(57) ABSTRACT

A photoelectric conversion device, comprising a photoelectric conversion portion, provided in a semiconductor substrate, including a first semiconductor region of a first conductivity type, a second semiconductor region of the first conductivity type provided adjacent to the first semiconductor region, a third semiconductor region of the first conductivity type provided at a position away from the second semiconductor region, and a gate electrode provided between the second semiconductor region and the third semiconductor region, wherein the second semiconductor region is provided at a position away from the gate electrode, and the semiconductor substrate includes a region of a second conductivity type within a region extending from an edge of the second semiconductor region to below the gate electrode.

8 Claims, 8 Drawing Sheets

(56) References Cited

FOREIGN PATENT DOCUMENTS

| | | |
|---|---|---|
| JP | 2006-121108 A | 5/2006 |
| JP | 2009-206260 A | 9/2009 |
| JP | 2010-239075 A | 10/2010 |
| JP | 2011-139427 A | 7/2011 |

* cited by examiner

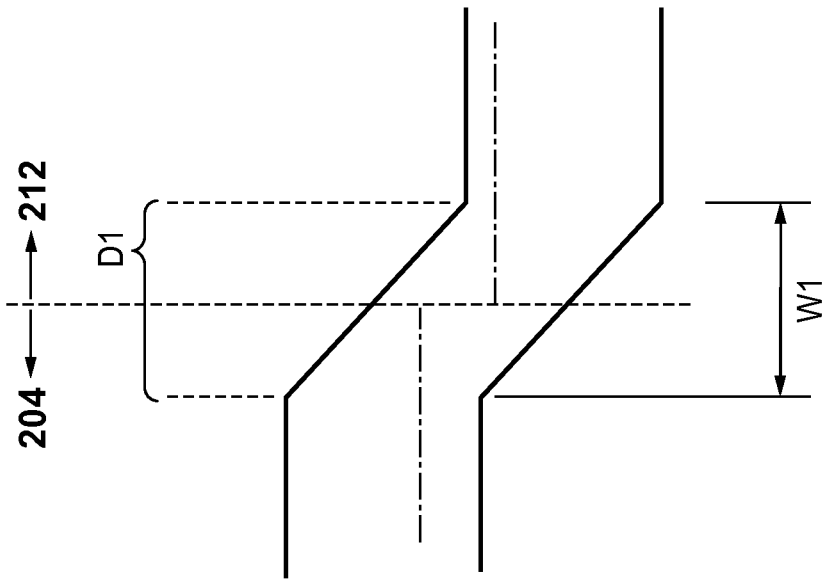
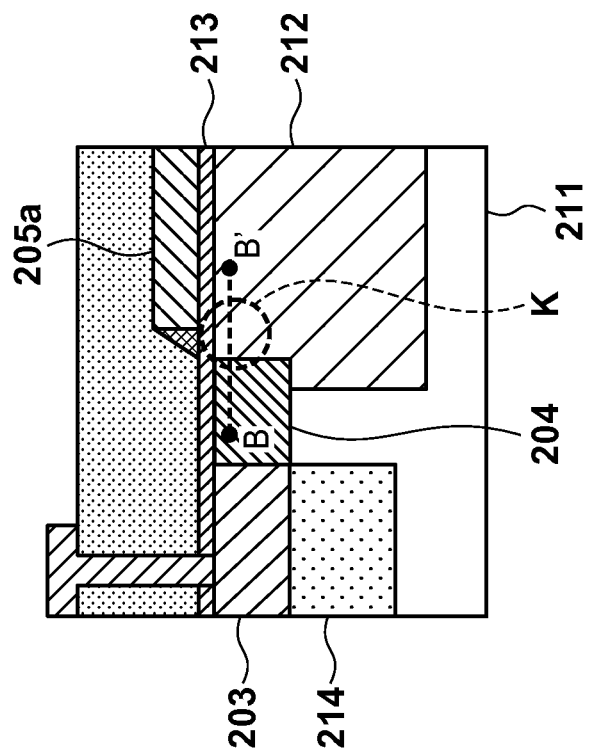

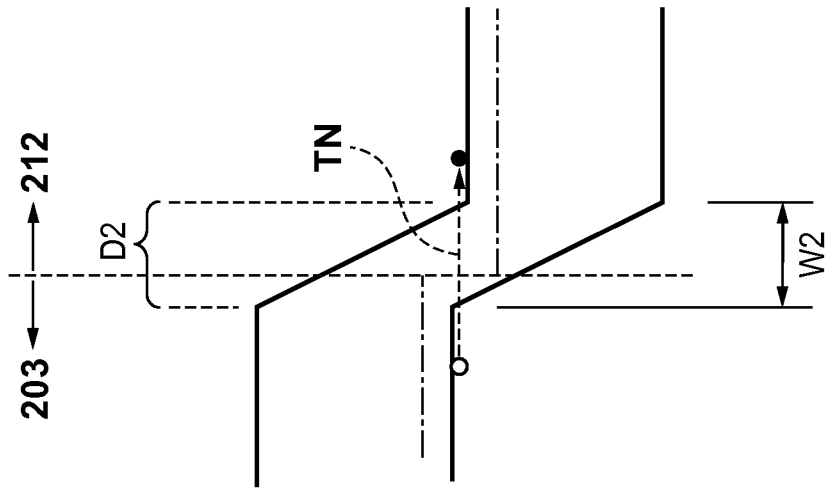
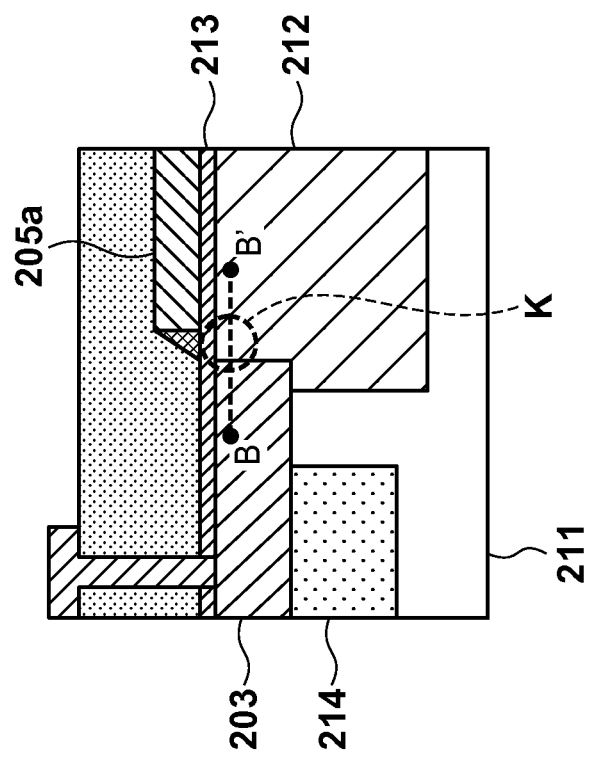

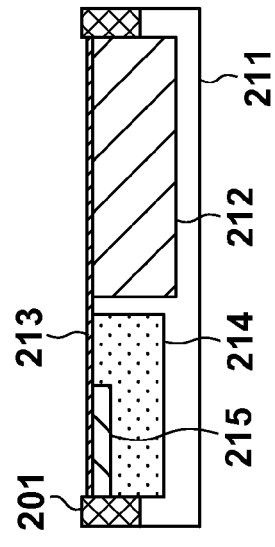
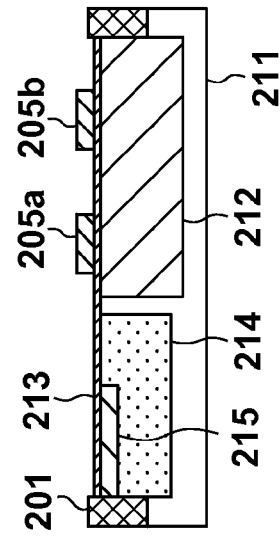
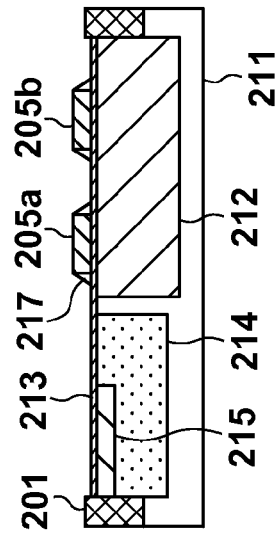
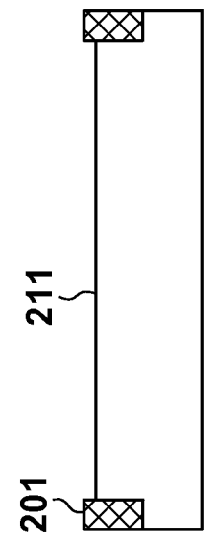
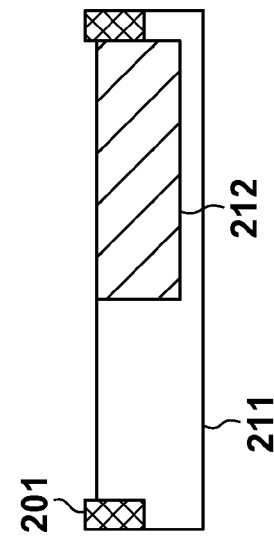
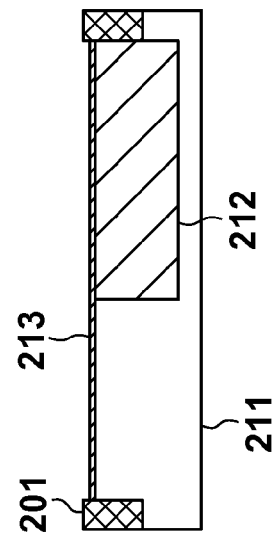

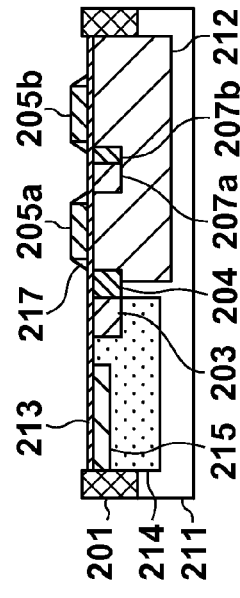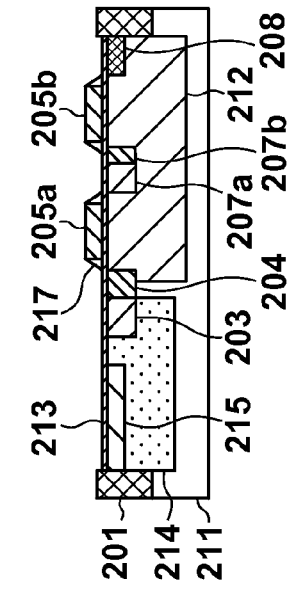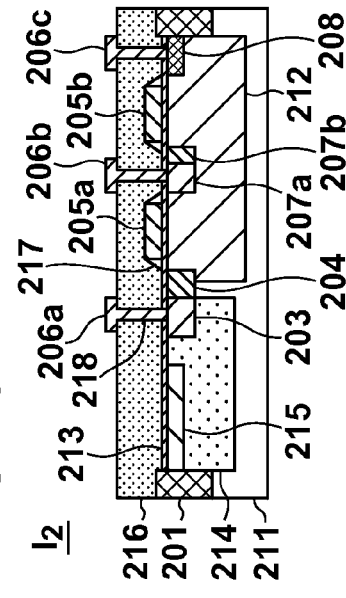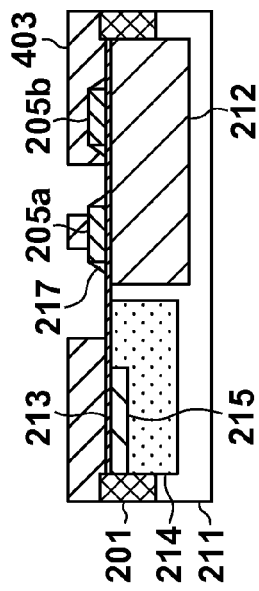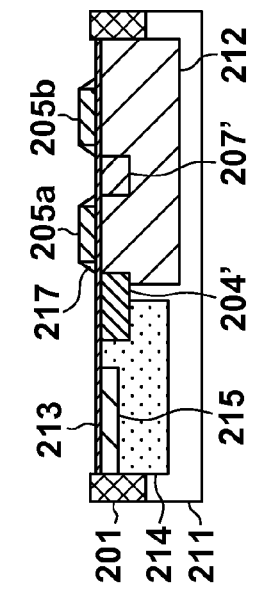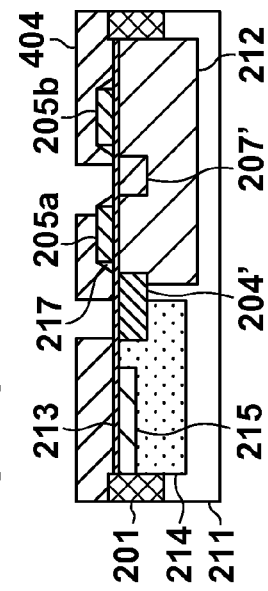

PHOTOELECTRIC CONVERSION DEVICE, METHOD OF MANUFACTURING THE SAME, AND CAMERA

BACKGROUND OF THE INVENTION

1. Field of the Invention

The present invention relates to a photoelectric conversion device, a method of manufacturing the same, and a camera.

2. Description of the Related Art

A photoelectric conversion device can include a photoelectric conversion portion and a transistor connected to the photoelectric conversion portion. The transistor charges a charge holding portion such as a capacitive element with the electric charges accumulated by the photoelectric conversion portion, in response to the activation of a control signal supplied to the gate. In a photoelectric conversion device having such a structure, it is important to suppress a dark current in order to suppress the occurrence of noise. Japanese Patent Laid-Open No. 2005-223146 discloses a technique of suppressing a dark current generated at a diffusion layer end of a reset element contacting a photodiode by covering an impurity region and an element isolation region on the photodiode side of the reset element adjacent to the photodiode with a lightly doped diffusion layer.

Japanese Patent Laid-Open No. 2005-223146 does not disclose anything about the suppression of a dark current generated by the operation of a transistor placed adjacent to a photoelectric conversion portion.

SUMMARY OF THE INVENTION

It is an object of the present invention to provide a photoelectric conversion device advantageous in reducing a dark current, that is noise, originating from the operation of a transistor provided adjacent to a photoelectric conversion element.

One of the aspects of the present invention provides a photoelectric conversion device, comprising a photoelectric conversion portion, provided in a semiconductor substrate, including a first semiconductor region of a first conductivity type, a second semiconductor region of the first conductivity type, provided adjacent to the first semiconductor region, having a lower concentration of an impurity of the first conductivity than the first semiconductor region, a third semiconductor region of the first conductivity type provided at a position away from the second semiconductor region, and a gate electrode provided on an insulation film on the semiconductor substrate between the second semiconductor region and the third semiconductor region, wherein, in a planar view, the second semiconductor region is provided at a position away from the gate electrode, and the semiconductor substrate includes a region of a second conductivity type different in polarity from the first conductivity type within a region extending from an edge of the second semiconductor region to below the gate electrode.

Further features of the present invention will become apparent from the following description of exemplary embodiments with reference to the attached drawings.

BRIEF DESCRIPTION OF THE DRAWINGS

FIGS. 3A and 3B are views for explaining potential states in the photoelectric conversion device according to the first embodiment;

FIGS. 4A and 4B are views for explaining potential states in a photoelectric conversion device as a reference example;

FIGS. 6A to 6L are views for explaining an example of a method of manufacturing a photoelectric conversion device according to the second embodiment.

DESCRIPTION OF THE EMBODIMENTS

A photoelectric conversion device can be used for a solid-state image sensor for imaging or focus detection. For example, when the photoelectric conversion device is to be used for focus detection, it can have a plurality of operation modes including, for example, a high-sensitivity mode and a low-sensitivity mode to change the accuracy of focus detection in accordance with illuminance.

Figure 1:
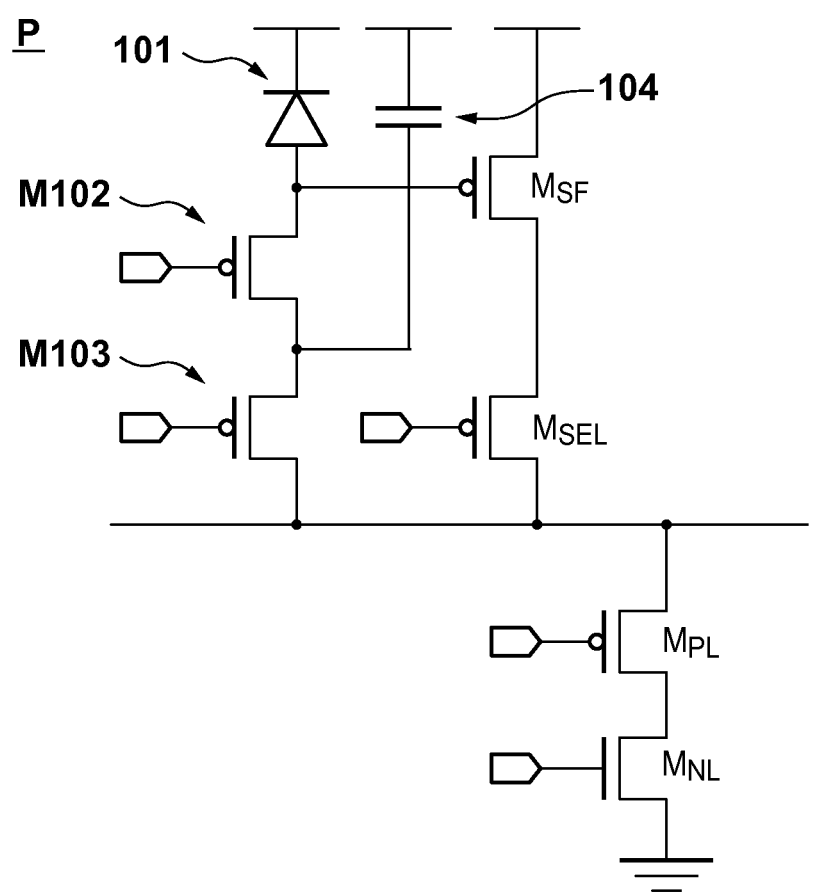
FIG. 1 is a circuit diagram for explaining an example of the circuit arrangement of a photoelectric conversion device.

FIG. 1 exemplifies the circuit arrangement of a pixel cell P in a photoelectric conversion device capable of switching light sensitivities. The pixel cell P can include a photoelectric conversion portion 101 (photodiode), a plurality of transistors including a transistor M102, and a capacitive element C104. The anode of the photoelectric conversion portion 101 is connected to the gate of a transistor $M_{SF}$. The gate potential of the transistor $M_{SF}$ fluctuates in accordance with the amount of electric charges generated by the photoelectric conversion portion 101. When a transistor $M_{SEL}$ is then rendered conductive, a current corresponding to the gate potential fluctuation flows in the transistor $M_{SF}$.

The transistor M102 is a p-channel MOS transistor for sensitivity switching. This transistor is non-conductive in the high-sensitivity mode, and conductive in the low-sensitivity mode. While the transistor M102 is conductive, the capacitive element C104 can be charged with some of the electric charges generated by the photoelectric conversion portion 101. Therefore, a change in the gate potential of the transistor $M_{SF}$ due to the generation of electric charges by the photoelectric conversion portion 101 is larger while the transistor M102 is non-conductive than while the transistor M102 is conductive. That is, switching the operation modes will change the amount of current flowing in the transistors $M_{SF}$ and $M_{SEL}$ even if the amount of electric charges generated by the photoelectric conversion portion 101 remains the same.

A transistor M103 is a p-channel MOS transistor connected in series with the transistor M102. The capacitive element C104 can be initialized by rendering the transistor M103 conductive. In addition, for example, transistors $M_{PL}$ and $M_{NL}$ can be provided as a load.

First Embodiment

Figure 2A:
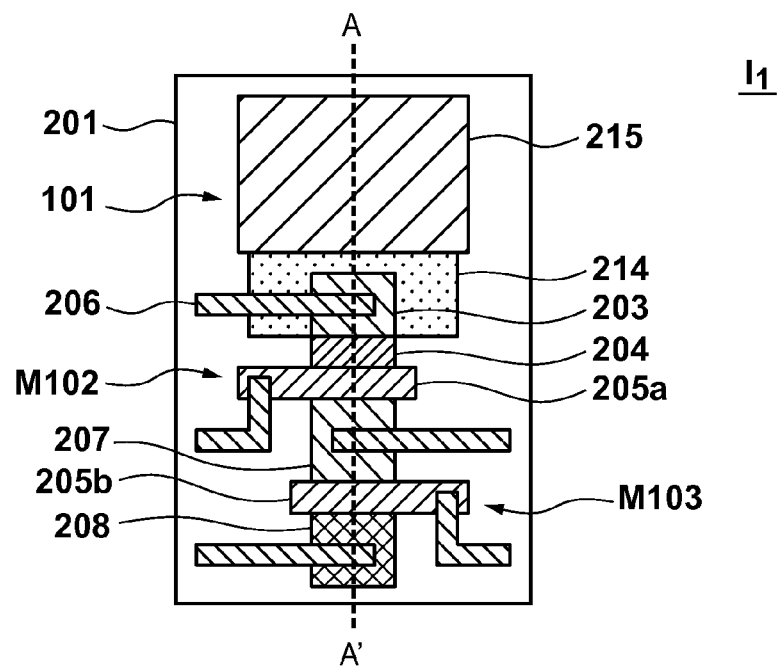
FIGS. 2A and 2B are views for explaining an example of the arrangement of a photoelectric conversion device according to the first embodiment.
Figure 2B:
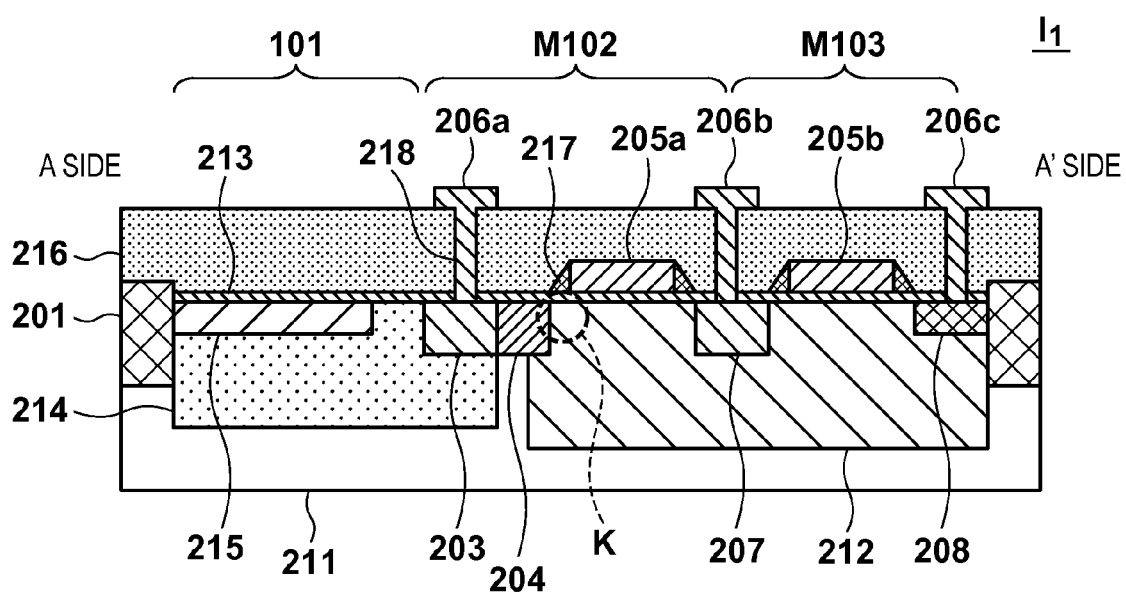

A photoelectric conversion device $I_1$ according to the first embodiment will be described with reference to FIGS. 2A to 5L. FIGS. 2A and 2B schematically show an example of the layout arrangement of a portion including a photoelectric conversion portion 101 and transistors M102 and M103 in the circuit arrangement exemplified by FIG. 1 in the photoelectric conversion device $I_1$. FIG. 2A is a plan view. FIG. 2B shows a sectional structure taken along a cut line A-A'.

The respective elements including the photoelectric conversion portion 101 and the transistors M102 and M103 are provided on a semiconductor substrate 211 (to be simply referred to as a "substrate 211" hereinafter) provided with, for example, an n-type epitaxial layer. The photoelectric conversion portion 101 is formed by the n-type epitaxial layer, a p-type well 214 provided on the epitaxial layer, and an n-type semiconductor region 215 provided in the p-type well 214.

In addition, the transistors M102 and M103 are provided in an n-type well 212 provided in the substrate 211, and can be formed by the respective semiconductor regions provided in the n-type well 212 and gate electrodes and the like provided on an insulation film on the n-type well 212.

More specifically, a p-type semiconductor region 203 (first semiconductor region) is provided so as to form part of the photoelectric conversion portion 101 (in this case, an end portion of the p-type well 214). A p-type semiconductor region 204 (second semiconductor region) is provided adjacent to the p-type semiconductor region 203. A p-type semiconductor region 207 (third semiconductor region) is provided at a position away from the p-type semiconductor region 204. A gate electrode 205a for the formation of a channel between the p-type semiconductor region 204 and the p-type semiconductor region 207 is provided on a gate insulation film 213 on the substrate 211. A side wall spacer 217 is provided so as to cover a side surface of the gate electrode 205a. An n-type region exists below the gate electrode 205a and the side wall spacer 217 at a portion near the surface of the substrate 211. With this structure, the transistor M102 is formed. In a planar view of the substrate 211, the transistor M102 has a so-called gate offset structure having a gap between the p-type semiconductor region 204 and the gate electrode 205a. In other words, in a planar view of the transistor M102, the p-type semiconductor region 204 is provided at a position away from the gate electrode 205a. Note that a portion K indicates a neighborhood below the side wall spacer 217.

In addition, a gate electrode 205b for forming a channel between the p-type semiconductor region 207 and a p-type semiconductor region 208 (fourth semiconductor region) provided at a position away from the p-type semiconductor region 207 is provided on the gate insulation film 213 on the substrate 211. In addition, the side wall spacer 217 is provided to cover a side surface of the gate electrode 205b. With this structure, the transistor M103 is formed.

As exemplified by FIG. 2A, an element isolation region 201 defines the width, length, and the like of the active region of each semiconductor region of each of the elements including the photoelectric conversion portion 101 and the transistors M102 and M103.

In addition, as exemplified by FIG. 2B, an interlayer dielectric film 216 is provided so as to cover the respective elements including the photoelectric conversion portion 101 and the transistors M102 and M103 and the element isolation region 201. The respective semiconductor regions can be electrically connected to first wiring patterns 206, that is, 206a to 206c, via, for example, contacts 218, that is, 218a to 218c, provided on the interlayer dielectric film 216. For example, the wiring pattern 206a can be connected to the gate electrode (not shown) of the transistor $M_{SF}$ described above. An opening for the formation of the contact 218 is provided to expose the p-type semiconductor region 203 so as to make the contact 218 in ohmic contact and properly electrically connect a portion, of the photoelectric conversion portion 101, which corresponds to an anode to the gate of the transistor $M_{SF}$.

The p-type impurity concentration of the p-type semiconductor region 204 is lower than that of the p-type semiconductor region 203. Note that the p-type (first conductivity type) impurity concentration indicates the net concentration of the p-type impurity, and the n-type (second conductivity type different in polarity from first conductivity type) impurity concentration indicates the net concentration of the n-type impurity. If, for example, a p-type semiconductor region is formed to contain an n-type impurity and a p-type impurity larger in amount than the n-type impurity, the impurity concentration of the p-type semiconductor region is indicated by the absolute value of the concentration difference between the p-type impurity and the n-type impurity. In this case, the impurity concentration of the p-type semiconductor region 204 is, for example, equal to or less than $1/10$ (for example, about $1/100$) of the impurity concentration of the p-type semiconductor region 203.

FIG. 3A schematically shows the sectional structure of a region including the p-type semiconductor region 204 and the transistor M102 in the arrangement of this embodiment. FIG. 3B schematically shows a band diagram taken along a cut line B-B' in FIG. 3A.

Like FIGS. 3A and 3B, FIGS. 4A and 4B schematically show a sectional structure and a band diagram of a region as a reference example. In this reference example, a region where the p-type semiconductor region 204 is to be formed is formed with the same impurity concentration as that of the p-type semiconductor region 203 (the p-type semiconductor region 204 in FIGS. 4A and 4B is formed with an impurity concentration higher than that of the p-type semiconductor region 204 in FIGS. 3A and 3B).

In this embodiment (FIGS. 3A and 3B), the impurity concentration of the p-type semiconductor region 204 is equal to or less than $1/10$ of that of the p-type semiconductor region 203. That is, the impurity concentration of the p-type semiconductor region 204 is set low. According to this arrangement, when the transistor M102 is in a non-conductive state (when a positive bias is applied to the gate electrode 205a), a depletion layer D1 between a portion K and the p-type semiconductor region 204 can expand not only to the portion K side but also to the p-type semiconductor region 204 side. In contrast to this, according to the reference example (FIGS. 4A and 4B), a depletion layer D2 between a portion K and the p-type semiconductor region 204 can mainly expand to the portion K side. In the portion K is positioned within a region extending from an edge of the p-type semiconductor region 204 to below the gate electrode 205a.

As is obvious from the comparison between this embodiment (FIG. 3B) and the reference example (FIG. 4B), a width W1 of the depletion layer D1 in the embodiment when the transistor M102 is in a non-conductive state is larger than a width W2 of the depletion layer D2 in the reference example. This indicates, according to the embodiment, that the electric field generated at the potential barrier on the source side of the transistor M102 is relaxed. When the electric field is relaxed with an increase in depletion layer width, the probability of the occurrence of electron-hole tunneling (an arrow TN in FIG. 4B) decreases. Electron-hole tunneling caused when the transistor M102 is in a non-conductive state can generate a leak current which is the cause of a noise component (a dark current). Therefore, according to this embodiment, since the occurrence probability of electron-hole tunneling decreases, noise can be reduced.

In addition, increasing the depletion layer width will reduce electric charges at the interface between the substrate and the insulation film near the source of the transistor M102 owing to the electric field of the depletion layer. This indicates that it is possible to reduce the probability of trapping electric charges at the interface and hence can reduce noise. Furthermore, the transistor M102 in this embodiment uses the so-called gate offset structure, which can relax the electric field generated at the portion K by the positive bias applied to the gate electrode 205a. For the same reason, therefore, noise can be reduced.

Note that since the impurity concentration of the p-type semiconductor region 204 is lower than that of the p-type semiconductor region 203, a resistance value (sheet resistance value) per unit area is larger than that of the p-type semiconductor region 203. Therefore, increasing the length (in a current flowing direction) of the p-type semiconductor region 204 more than necessary can reduce the driving force of the transistor M102 in a conductive state. For this reason, the length of the p-type semiconductor region 204 may be set to a proper value by calculating the depletion layer width W1 from the impurity concentration of each semiconductor region, the voltage value applied to the transistor M102, and the like.

The above description about tunneling can be applied not only to the transistor M102 but also to the transistor M103.

Figure 5A:
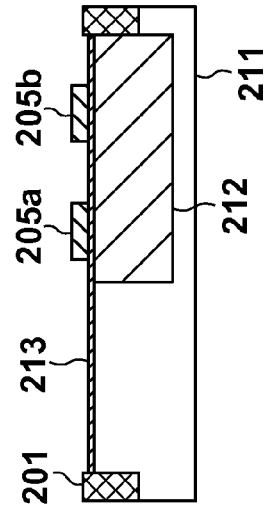
FIGS. 5A to 5L are views for explaining an example of a method of manufacturing the photoelectric conversion device according to the first embodiment.

A method of manufacturing the photoelectric conversion device $I_1$ according to this embodiment will be exemplified with reference to FIGS. 5A to 5L. First of all, as shown in FIG. 5A, the element isolation region 201 is formed on the substrate 211 including, for example, an n-type epitaxial layer by, for example, a LOCOS method.

Figure 5B:
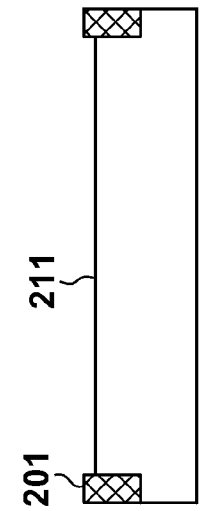

As shown in FIG. 5B, the n-type well 212 is formed by a photolithography technique in a region where p-channel MOS transistors (transistors M102 and M103) are to be formed later. More specifically, a photoresist pattern having an opening in a region where the n-type well 212 is to be formed is formed on the substrate 211. An n-type impurity (for example, phosphorus) is then implanted to form the n-type well 212. In addition, a p-type well (not shown) can be formed in a region where an n-channel MOS transistor is to be formed, in the same procedure, by implanting a p-type impurity (for example, boron).

Figure 5D:
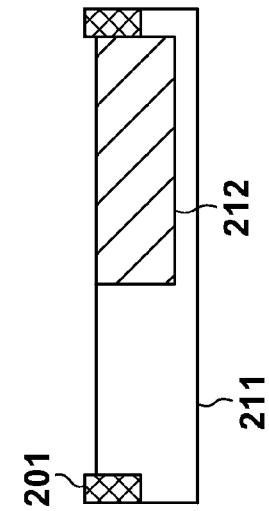
Figure 5C:
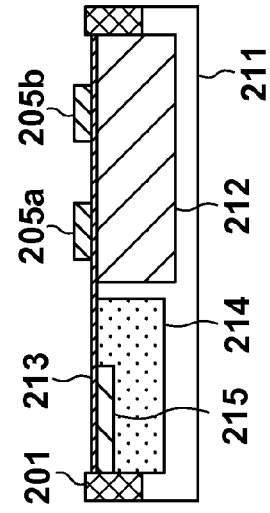

As shown in FIG. 5C, the gate insulation film 213 is formed by a thermal oxidation process in an active region partitioned by the element isolation region 201 on the substrate 211.

Subsequently, as shown in FIG. 5D, the gate electrodes 205a and 205b are formed on the gate insulation film 213. Each of the gate electrodes 205a and 205b is provided with a thickness of about 0.15 μm to 0.5 μm. In this case, for example, the thickness is 0.25 μm. The gate electrodes 205a and 205b can be obtained by forming a polysilicon layer by, for example, a CVD method and patterning the polysilicon layer by a photolithography technique and an etching technique.

Figure 5E:
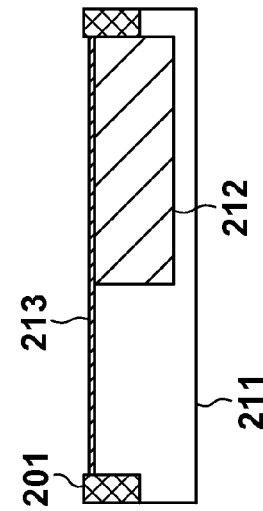

As shown in FIG. 5E, a photoelectric conversion portion is formed on the substrate 211 by a photolithography technique. More specifically, a photoresist pattern having an opening in a region where the p-type well 214 is to be formed is formed on the substrate 211. Thereafter, the p-type well 214 is formed by implanting a p-type impurity (for example, boron). A photoresist pattern having an opening in a region where the n-type semiconductor region 215 is to be formed is then provided on the substrate 211. Thereafter, the n-type semiconductor region 215 is formed by implanting an n-type impurity (for example, arsenic).

Figure 5F:
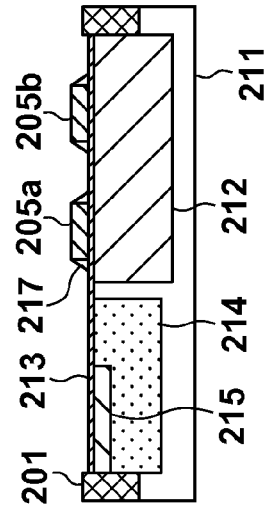

Next, as shown in FIG. 5F, the side wall spacers 217 are formed so as to cover side surfaces of the gate electrodes 205a and 205b, respectively. The side wall spacer 217 is provided with a spacer width of about 0.05 μm to 0.5 μm. In this case, the spacer width is 0.1 μm. As a material for the side wall spacer 217, for example, silicon oxide is used. The side wall spacer 217 can be formed by depositing a silicon oxide film by a CVD method and anisotropically etching the film. As a material for the side wall spacer 217, silicon nitride or silicon oxynitride may be used.

Figure 5G:
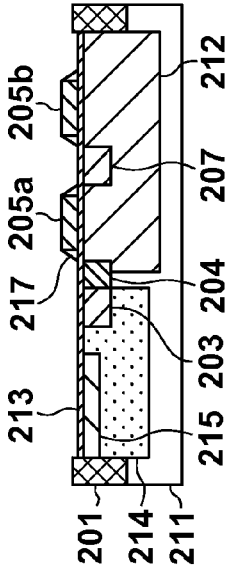

Next, as shown in FIG. 5G, a photoresist pattern 401 having an opening in a region where a region 204' is to be formed is formed on the substrate 211. The region 204' is a region including the p-type semiconductor region 203 and the p-type semiconductor region 204.

Figure 5H:
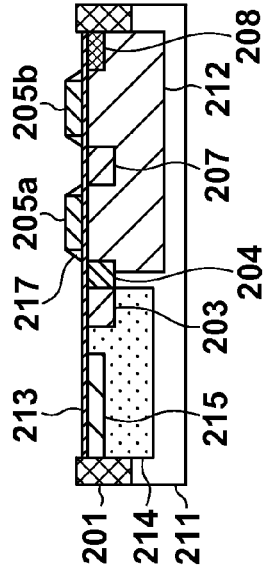

Subsequently, as shown in FIG. 5H, the region 204' is formed on the substrate 211. The region 204' is formed by implanting a p-type impurity (for example, boron) using the photoresist pattern 401, the gate electrode 205a, and the side wall spacer 217 on the p-type well 214 side as masks. This impurity implantation can be performed, for example, with a dose of $1.0 \times 10^{13}$ to $5.0 \times 10^{13}$ cm$^{-2}$ at an implantation energy of 15 keV. The distance between the region 204' and the gate electrode 205a is constant regardless of alignment accuracy because the region 204' is formed by self alignment using the side wall spacer 217.

Figure 5I:
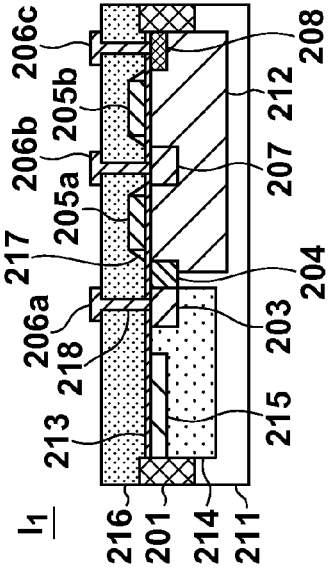

Next, as shown in FIG. 5I, a photoresist pattern 402 having openings in regions where the p-type semiconductor regions 203 and 207 are to be formed is formed on the substrate 211.

Figure 5J:
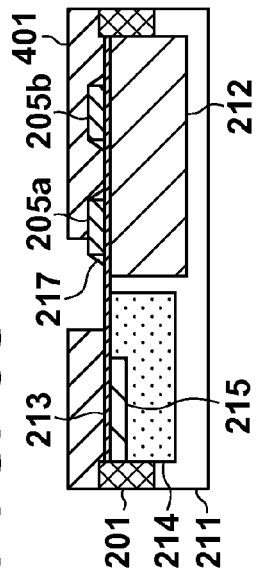

Subsequently, as shown in FIG. 5J, the p-type semiconductor regions 203, 204, and 207 are formed in the substrate 211. The p-type semiconductor regions 203, 204, and 207 are formed by implanting a p-type impurity (for example, boron) using the photoresist pattern 402 as a mask. This impurity implantation can be performed, for example, with a dose of $5.0 \times 10^{14}$ to $1.0 \times 10^{15}$ cm$^{-2}$ at an implantation energy of 15 keV. With this process, the p-type semiconductor region 203 and the p-type semiconductor region 204 are formed adjacent to each other in the region 204'. The impurity concentration of the p-type semiconductor regions 203 and 207 is about 10 to 100 times that of the p-type semiconductor region 204. The p-type semiconductor region 203 is provided so as to set the distance between the gate electrode 205a and the boundary between the p-type semiconductor region 203 and the p-type semiconductor region 204 to, for example, about 0.4 μm to 0.8 μm.

Figure 5K:
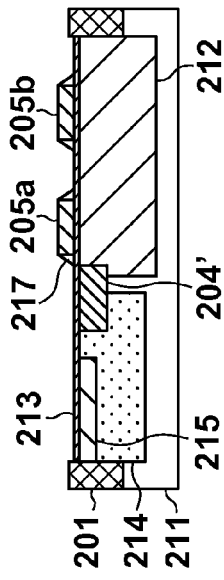

Next, as shown in FIG. 5K, the p-type semiconductor region 208 is formed on the substrate 211 by implanting a p-type impurity (for example, boron) using a photolithography technique similar to that described above. In addition, the source region and drain region of an n-channel MOS transistor (not shown) can be formed by implanting an n-type impurity (for example, phosphorus) in a similar procedure.

Figure 5L:
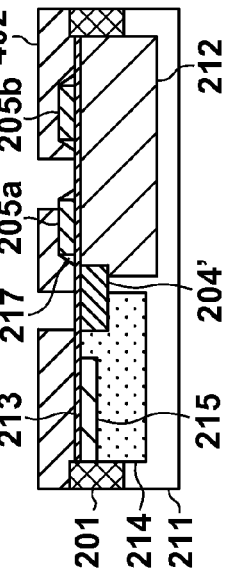

Finally, as shown in FIG. 5L, the interlayer dielectric film 216, the contact 218, and the first wiring layer including the wiring pattern 206 can be sequentially formed on the substrate 211. More specifically, the interlayer dielectric film 216 is deposited on the substrate 211 by, for example, a CVD method. An opening for the provision of the contact 218 can be then formed in the interlayer dielectric film 216 by a photolithography technique and an etching technique. Subsequently, the contact 218 and the wiring pattern 206 can be formed by depositing a metal layer on the interlayer dielectric film 216 having the opening by, for example, a sputtering method and patterning the metal layer. Note that repeating this process in the same manner can further stack the second interlayer dielectric film and the second wiring layer on the interlayer dielectric film 216 and the wiring pattern 206.

The photoelectric conversion device $I_1$ can be manufactured in the above manner. According to the photoelectric conversion device $I_1$, the width W1 of the depletion layer D1 when the transistor M102 is in a non-conductive state becomes large. This relaxes the electric field generated at the potential barrier on the source side of the transistor M102. As a consequence, the occurrence probability of electron-hole tunneling when the transistor M102 is in a non-conductive state decreases, and noise can be reduced. According to the manufacturing method of this embodiment, the distance between the p-type semiconductor region 204 and the gate electrode 205a is constant regardless of alignment accuracy because the p-type semiconductor region 204 is formed by self alignment using the side wall spacer 217. According to the manufacturing method of the embodiment, therefore, the electrical characteristics and noise reducing effect of the photoelectric conversion device $I_1$ are robust against the influence of misalignment.

Although in this embodiment, attention is paid to the transistor M102, the same form as that of the transistor M102 in the embodiment can be adopted to only the transistor M103 in order to reduce a dark current originating from the transistor. It is more preferable to adopt the same form as that of the transistor M102 in this embodiment for both the transistors M102 and M103.

Second Embodiment

A photoelectric conversion device $I_2$ and a method of manufacturing the same according to the second embodiment will be described with reference to FIGS. 6A to 6L. FIGS. 6A to 6L are views for explaining an example of the method of manufacturing the photoelectric conversion device $I_2$. FIG. 6L shows the completed photoelectric conversion device $I_2$. This embodiment differs from the first embodiment in that a p-type semiconductor region 207 includes a first region 207a and a second region 207b having a lower impurity concentration than the first region 207a. That is, like transistor M102, a transistor M103 uses a structure in which a source region includes two regions with different impurity concentrations. Even this structure can also obtain the same effect as in the first embodiment.

FIGS. 6A to 6F are the same as those in the first embodiment (FIGS. 5A to 5F), and hence a description of them will be omitted. Subsequently, as shown in FIG. 6G, a photoresist pattern 403 having openings in regions where regions 204' and 207' are to be formed is formed on a substrate 211. A region 207' is a region including the first and second regions 207a and 207b.

As shown in FIG. 6H, the regions 204' and 207' are formed on the substrate 211. These regions may be formed under the same conditions as those in the first embodiment (FIG. 5H). As described in the first embodiment, the distance between the region 204' and a gate electrode 205a is constant regardless of alignment accuracy because the region 204' is formed by self alignment using the side wall spacer 217. For the same reason, the distance between the region 207' and the gate electrode 205a and the distance between the region 207' and a gate electrode 205b are also constant.

Next, as shown in FIG. 6I, a photoresist pattern 404 having openings in regions where a p-type semiconductor region 203 and a region 207a are to be formed is formed on the 211.

Subsequently, as shown in FIG. 6J, the p-type semiconductor region 203, a p-type semiconductor region 204, and the regions 207a and 207b are formed on the substrate 211. These regions may be formed under the same conditions as those in the first embodiment (FIG. 5J). With this process, the p-type semiconductor region 203 and the p-type semiconductor region 204 are formed adjacent to each other in the region 204', and the region 207a and the region 207b are formed adjacent to each other in the region 207'. The impurity concentration of the p-type semiconductor region 203 and region 207a is about 10 to 100 times that of the p-type semiconductor region 204 and region 207b. In addition, the p-type semiconductor region 203 can be provided so as to set the distance between the gate electrode 205a and the boundary between the p-type semiconductor region 203 and the p-type semiconductor region 204 to, for example, about 0.4 μm to 0.8 μm. Furthermore, the region 207a can be provided so as to set the distance between the gate electrode 205b and the boundary between the regions 207a and 207b to, for example, about 0.4 μm to 0.8 μm.

Next, as shown in FIG. 6K, a p-type semiconductor region 208 is formed on the substrate 211 by implanting a p-type impurity (for example, boron) using a photolithography technique similar to that described above. The source region and drain region of an n-channel MOS transistor (not shown) can be formed by implanting an n-type impurity (for example, phosphorus) in a similar procedure.

Finally, as shown in FIG. 6L, an interlayer dielectric film 216, a contact 218, and a first wiring layer including a first wiring pattern 206 can be sequentially formed on the substrate 211. More specifically, the interlayer dielectric film 216 is deposited on the substrate 211 by, for example, a CVD method. An opening for the provision of the contact 218 can be then formed in the interlayer dielectric film 216 by a photolithography technique and an etching technique. Subsequently, the contact 218 and the wiring pattern 206 can be formed by depositing a metal layer on the interlayer dielectric film 216 having the opening by, for example, a sputtering method and patterning the metal layer.

The present invention is not limited to the above embodiments. The present invention can be changed, as needed, in accordance with objects, states, applications, functions, and other specifications, and can be implemented by other embodiments. For example, each embodiment described above has exemplified the circuit shown in FIG. 1 as an example of the arrangement of a photoelectric conversion device. However, the photoelectric conversion device is not limited to this arrangement, and may use other known arrangements. For example, the photoelectric conversion device may use an arrangement including a photoelectric conversion portion and a transfer transistor which transfers electric charges generated by the photoelectric conversion portion to a semiconductor region (floating diffusion).

In addition, the above embodiments can be applied to an imaging system typified by a camera or the like. The concept of the imaging system includes not only an apparatus mainly aimed at imaging but also an apparatus including an imaging function as an auxiliary function (for example, a personal computer or a portable terminal). The imaging system can include the photoelectric conversion device according to the present invention, which has been exemplified as each embodiment described above, a solid-state image sensor including the photoelectric conversion device, and a processing unit which processes the signal output from the solid-state image sensor. This processing unit can include, for example, an A/D converter and a processor which processes the digital data output from the A/D converter.

While the present invention has been described with reference to exemplary embodiments, is to be understood that the invention is not to the disclosed exemplary embodiments. The scope of the following claims is to be accorded the broadest interpretation so as to encompass all such modifications and equivalent structures and functions.

This application claims the benefit of Japanese Patent Application No. 2013-154959, filed Jul. 25, 2013, which is hereby incorporated by reference herein in its entirety.

What is claimed is:

1. A photoelectric conversion device comprising:
    a photoelectric conversion portion, provided in a semiconductor substrate, including a first semiconductor region of a first conductivity type;
    a second semiconductor region of the first conductivity type, provided adjacent to the first semiconductor region, having a lower concentration of an impurity of the first conductivity than the first semiconductor region;
    a third semiconductor region of the first conductivity type provided at a position away from the second semiconductor region; and
    a gate electrode provided on an insulation film on the semiconductor substrate between the second semiconductor region and the third semiconductor region,
    wherein, in a planar view, the second semiconductor region is provided at a position away from the gate electrode, and
    the semiconductor substrate includes a region of a second conductivity type different in polarity from the first conductivity type within a region extending from an edge of the second semiconductor region to below the gate electrode.

2. The device according to claim 1, wherein the concentration of the impurity of the first conductivity type of the second semiconductor region is not more than 1/10 of that of the first semiconductor region.

3. The device according to claim 1, further comprising:
    a fourth semiconductor region of the first conductivity type provided at a position away from the third semiconductor region; and
    a second gate electrode provided on an insulation film on the semiconductor substrate between the third semiconductor region and the fourth semiconductor region,
    wherein, in a planar view, the third semiconductor region is provided at a position away from the second gate electrode,
    the semiconductor substrate includes a second region of the second conductivity type in a region extending from an edge of the third semiconductor region to below the second gate electrode, and
    the third semiconductor region sequentially includes a first portion and a second portion in a direction from the gate electrode to the second gate electrode, the second portion having a lower concentration of an impurity of the first conductivity than the first portion.

4. The device according to claim 3, wherein the concentration of the impurity of the first conductivity type of the first portion is equal to that of the first semiconductor region, and
    the concentration of the impurity of the first conductivity type of the second portion is equal to that of the second semiconductor region.

5. A photoelectric conversion device comprising:
    a photoelectric conversion portion, provided in a semiconductor substrate, including a first semiconductor region of a first conductivity type;
    a second semiconductor region of the first conductivity type, provided adjacent to the first semiconductor region, having a lower concentration of an impurity of the first conductivity than the first semiconductor region;
    a third semiconductor region of the first conductivity type provided at a position away from the second semiconductor region;
    a first gate electrode provided on an insulation film on the semiconductor substrate between the second semiconductor region and the third semiconductor region;
    a fourth semiconductor region of the first conductivity type provided at a position away from the third semiconductor region; and
    a second gate electrode provided on an insulation film on the semiconductor substrate between the third semiconductor region and the fourth semiconductor region,
    wherein, in a planar view, the third semiconductor region is located at a position away from the second gate electrode, and the semiconductor substrate includes a region of the second conductivity type within a region extending from an edge of the third semiconductor region to below the second gate electrode.

6. The device according to claim 1, wherein the first conductivity type is a p type, and boron is used as an impurity of the first conductivity type.

7. A camera comprising:
    a solid-state image sensor including a photoelectric conversion device defined in claim 1; and
    a processing unit configured to process a signal output from the solid-state image sensor.

8. A method of manufacturing a photoelectric conversion device, including
    a photoelectric conversion portion, provided in a semiconductor substrate, including a first semiconductor region of a first conductivity type,
    a second semiconductor region of the first conductivity type, provided adjacent to the first semiconductor region, having a lower concentration of an impurity of the first conductivity than the first semiconductor region,
    a third semiconductor region of the first conductivity type provided at a position away from the second semiconductor region, and
    a gate electrode provided on an insulation film on the semiconductor substrate and configured to form a channel between the second semiconductor region and the third semiconductor region,
    the method comprising:
    forming a side wall spacer on a side surface of the gate electrode; and
    forming the second semiconductor region at a position away from the gate electrode in a planar view by implanting an impurity using the gate electrode and the side wall spacer as masks,
    wherein the semiconductor substrate includes a region of a second conductivity type different in polarity from the first conductivity type within a region extending from an edge of the second semiconductor region to below the gate electrode.

* * * * *